United States Patent [19]

Matsuyama et al.

[11] Patent Number: 5,208,656
[45] Date of Patent: May 4, 1993

[54] MULTILAYER WIRING SUBSTRATE AND PRODUCTION THEREOF

[75] Inventors: Haruhiko Matsuyama, Hiratsuka; Mitsuo Yoshimoto, Yokohama; Jun Tanaka, Yokohama; Fusaji Shoji, Yokohama; Hitoshi Yokono, Toride; Takashi Inoue, Yokohama; Tetsuya Yamazaki, Yokohama; Minoru Tanaka, Yokohama; Hidetaka Shigi, Hadano, all of Japan

[73] Assignee: Hitachi, Ltd., Tokyo, Japan

[21] Appl. No.: 674,605

[22] Filed: Mar. 25, 1991

[30] Foreign Application Priority Data

Mar. 26, 1990 [JP] Japan ................................ 2-73491

[51] Int. Cl.⁵ .......................... B44C 1/22; H01L 23/48
[52] U.S. Cl. .................................... 174/253; 257/700; 257/724; 257/759
[58] Field of Search ........................... 357/71, 68, 65

[56] References Cited

U.S. PATENT DOCUMENTS

| | | | |
|---|---|---|---|
| 3,801,880 | 4/1974 | Harada et al. | 357/71 |
| 3,985,597 | 10/1976 | Zielinski | 357/71 |
| 4,386,116 | 5/1983 | Nair et al. | 357/71 |
| 4,463,059 | 7/1984 | Bhattacharya et al. | 357/68 |
| 4,523,372 | 6/1985 | Balda et al. | 357/71 |
| 4,525,383 | 6/1985 | Saito | 357/71 |
| 4,531,144 | 7/1985 | Holmberg | 357/71 |
| 4,556,897 | 12/1985 | Yorikane et al. | 357/71 |
| 4,659,427 | 4/1987 | Barry et al. | 357/71 |
| 4,786,360 | 11/1988 | Cote et al. | 357/71 |
| 5,021,869 | 6/1991 | Kaw | 357/68 |
| 5,040,049 | 8/1991 | Raaijnakers | 357/71 |

Primary Examiner—Eugene R. LaRoche
Assistant Examiner—Viet Q. Nguyen
Attorney, Agent, or Firm—Antonelli, Terry, Stout & Kraus

[57] ABSTRACT

A multilayer wiring substrate having high reliability can be produced in good productivity by subjecting metal wiring layers to stabilization treatment on the surface with a metal such as Cr, Mo or the like or an aqueous solution of water glass so as to prevent generation of hillocks or whiskers and to improve chemical resistance.

17 Claims, 3 Drawing Sheets

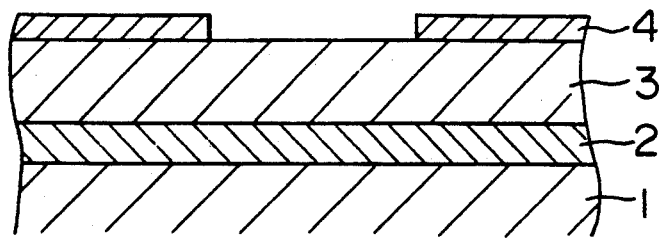
F I G. 3A
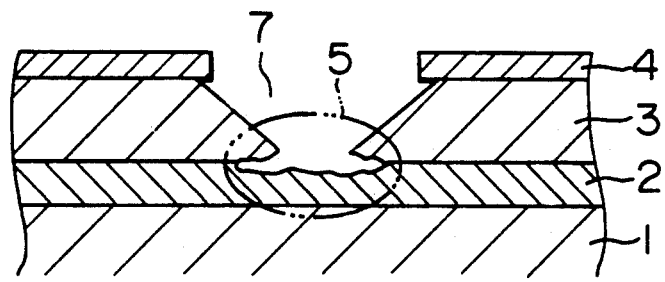
F I G. 3B
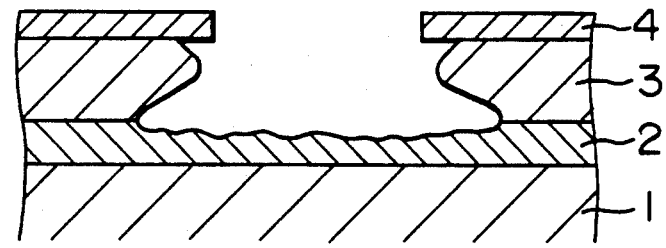
F I G. 3C
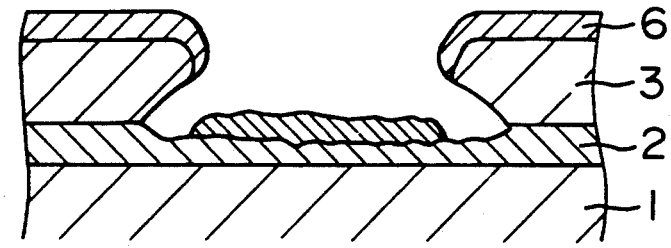
F I G. 3D

MULTILAYER WIRING SUBSTRATE AND PRODUCTION THEREOF

BACKGROUND OF THE INVENTION

This invention relates to a multilayer wiring substrate and a process for producing the same. More particularly, the present invention relates to a multilayer wiring substrate realizing thin film multilayering containing a metallic layer structure excellent in chemical resistance and prevention of generation of hillocks and whiskers.

Multilayer wiring substrates heretofore used in electronic computers and the like are formed by alternately laminating wiring layers and insulating layers on a substrate and connecting upper and lower wiring layers via through-holes formed through insulating layers. The material for insulating layers used in such multilayer wiring substrates is required to have properties such as a high glass transition point, excellent heat resistance, a small thermal expansion coefficient, security for processing precision. As a material meeting such requirements, there have generally been used polyimide resins.

As processes for producing multilayer substrates using a polyimide as an insulating layer, there are known a so-called wet etching method wherein a polyimide is subjected to pattern formation by wet etching (disclosed in, for example, IEEE, 33rd, Electronic Components Conferrence, pp. 610 to 615, 1983), and a so-called photosensitive polyimide method wherein a photosensitive polyimide is used for pattern formation (disclosed in, for example, IEEE, 34th Electronic Components Conference, pp. 82 to 87, 1984).

According to the wet etching method, the polyimide is coated on a substrate and cured with heating to form a film of predetermined thickness, followed by formation of a resist pattern thereon and etching of through-hole portions. Thus, processable film thickness depends on resistance to etching solution of the resist. When a metal resist such as Mo or the like is used, it is possible to process a film of upto about 50 $\mu$m in thickness. Thus, this method is advantageous for forming a thick film polyimide pattern necessary for multilayer wiring substrates compared with the photosensitive polyimide method. On the other hand, according to the photosensitive polyimide method, since a polyimide precursor is exposed to light and developed to directly form a pattern, followed by curing with heating, it is difficult to form a pattern of polyimide film of 10 $\mu$m or more in thickness considering light transmittance of the resulting photosensitive film.

In the case of applying the wet etching method or the photosensitive polyimide method, when Al is used as a wiring metal, there take place hillocks or whiskers and surface oxidation due to the thermal hysteresis of coated polyimide film during the curing step. When Cu is used as a wiring metal, surface oxidation easily takes place. In either case, such phenomena bring about problems of causing short circuit between wirings on the multilayer wiring substrate, and increasing a resistance value at connecting portions.

Further, according to the wet etching method, since a strong basic etching solution such as a hydrazine hydrate solution, an aqueous solution of potassium hydroxide, or the like is used for etching, many problems are brought about by generating corrosion of undercoating wiring metal, generating an undercut (a kind of erosion) at a tapered surface of lower portion of through-hole in polyimide film due to the generation of corrosion, generating falling of an upper wiring at the undercut portion, and damaging electric reliability of the multilayer substrate.

The wet etching method is explained referring to FIGS. 3A to 3D. In FIGS. 3A to 3D, numeral 1 denotes a mullite substrate, numeral 2 denotes an Al metal wiring layer (Al wiring layer) formed by sputtering on the mullite substrate 1, numeral 3 denotes a polyimide insulating layer formed on the Al wiring layer, and numeral 4 denotes an etching resist necessary for patterning the polyimide insulating layer 3. When the polyimide insulating layer 3 in the state as shown in FIG. 3A is etched by using a hydrazine hydrate etching solution (e.g. hydrazine hydrate/ethylenediamine =7/3 by volume), the undercoating Al wiring layer 2 is exposed as shown in FIG. 3B. By this exposure, the exposed portion of the Al wiring layer 2 is corroded (hereinafter referred to as "Al corrosion") to generate the undercut 5 encircled by dotted line at the bottom portion of the tapered surface of the through-hole 7 in the polyimide insulating layer 3. The Al corrosion and the undercut 5 gradually grow until the state shown by FIG. 3C. Then, the etching resist 4 is peeled off. After peeling, an upper wiring layer 6 is formed on the polyimide insulating film 3 by sputtering or the like. But a portion of the upper wiring layer 6 formed is fallen as shown in FIG. 3D to cause failure in burying laminating metal wiring in a later step and generation of pin holes in the polyimide insulating layer 3, resulting in not only damaging electric reliability of multilayer wiring substrate but also lowering productivity of elements.

SUMMARY OF THE INVENTION

The present invention provides a multilayer wiring substrate having high reliability by preventing hillocks and whiskers and by preventing process damages at the time of polyimide insulating layer formation so as to overcome the problems of the known processes mentioned above, and a process for producing such a multilayer wiring substrate with high productivity.

The present invention provides a multilayer wiring substrate comprising a ceramic substrate containing a circuit comprising interlayer wirings and terminals for power supply and/or signal input and output, alternately laminated layers of metal wiring layers subjected to stabilization treatment on the surface and organic insulating layers, formed on at least one surface of the substrate, and a thin film circuit layer having terminals for power supply and/or signal input and output to be connected to LSI and formed on the surface of the laminated layers.

The present invention also provides a process for producing a multilayer wiring substrate which comprises (A) a step of connecting a metal wiring layer subjected to stabilization treatment on the surface to a circuit comprising interlayer wirings and terminals for power supply and/or signal input and output formed on a ceramic substrate, (B) a step of forming an organic insulating layer on the metal wiring layer, (C) a step of forming through-holes in the organic insulating layer for connecting the metal wirings and an upper wiring layer, (D) a step of forming the upper wiring layer on the surface of through-holes, (E) a step of repeating the steps of (B), (C) and (D) a plurality of times, (F) a step of forming an organic insulating layer on the upper wiring layer, (G) a step of forming through-holes on the surface layer of the organic insulating layer formed for connecting the upper wiring layer to surface terminals for power supply and/or signal input and output, and (H) a step of forming a layer of the surface terminals on the through-hole.

BRIEF DESCRIPTION OF THE DRAWINGS

FIGS. 3A to 3D are cross-sectional views explaining a wet etching method according to a known process.

DESCRIPTION OF THE PREFERRED EMBODIMENTS

Figure 1:
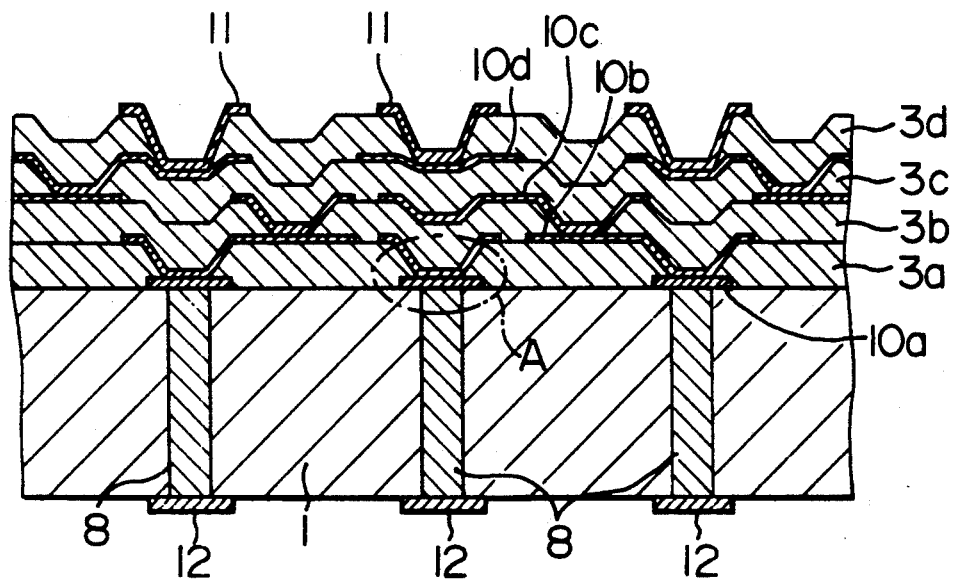
FIG. 1 is a cross-sectional view of one example of the multilayer wiring substrate of the present invention.

The multilayer wiring substrate of the present invention comprises a ceramic substrate containing a circuit comprising interlayer wirings and terminals for power supply and/or signal input and output, alternately laminated layers of metal wiring layers subjected to stabilization treatment on the surface and organic insulating layers formed on at least one surface of the substrate, and a thin film circuit layer having terminals for power supply and/or signal input and output to be connected to LSI (large-scale integrated circuits) and formed on the surface of the laminated layers.

The interlayer wirings is preferably made of W, Mo, Cu or the like.

As the ceramic substrate, there can be preferably used substrates made of alumina, mullite, SiC, glass ceramic, etc.

The metal wiring layer is preferably made of Al, Cu, Al-Si, Al-Si-Ti, Al-Cu, etc.

The organic insulating layer is preferably made from a polyimide resin, such as aromatic polyimides, preferably containing isoindroquinazoline rings, etc.

The stabilization treatment on the metal wiring layer can be carried out by coating a metal or dipping in aqueous solution of water glass. As the metal for coating, there can be used metals of Cr, Mo, W, Cu, Au, Ni-Cu, etc.

The metal is preferably coated in the thickness of 0.05 to 0.5 $\mu$m by sputtering, or the like.

The multilayer wiring substrate can be produced by the process comprising (A) a step of connecting a metal wiring layer subjected to stabilization treatment on the surface to a circuit comprising interlayer wirings and terminals for power supply and/or signal input and output formed on a ceramic substrate, (B) a step of forming an organic insulating layer on the metal wiring layer, (C) a step of forming through-holes in the organic insulating layer for connecting the metal wirings and an upper wiring layer, (D) a step of forming the upper wiring layer on the surface of through-holes, (E) a step of repeating the steps of (B), (C) and (D) a plurality of times, (F) a step of forming an organic insulating layer on the upper wiring layer, (G) a step of forming through-holes on the surface layer of the organic insulating layer formed for connecting the upper wiring layer to surface terminals for power supply and/or signal input and output, and (H) a step of forming a layer of the surface terminals on the through-holes.

The stabilization treatment of the metal wiring layer can preferably be carried out by coating a metal of Cr, Mo, etc., as mentioned above in the thickness of 0.05 to 0.5 $\mu$m.

It is possible to carry out the stabilization treatment by dipping the metal wiring layer in an aqueous solution of water glass when the metal wiring layer is made of Al. The dipping in the aqueous solution of water glass can preferably be carried out by using an aqueous solution of water glass of a concentration of 1 to 20% by weight at a solution temperature of 20° to 60° C. for a dipping time of 0.1 to 10 minutes.

As the organic insulating layer, it is preferable to use a polyimide resin.

Since the multilayer wiring substrate of the present invention can be produced by the process mentioned above, it is possible to passivate the surface of metal wiring layer against circumstances of the production process of the multilayer wiring substrate, to prevent corrosion of the undercoating wiring metal generated by a strong basic etching solution such as a hydrazine hydrate solution or an aqueous solution of potassium hydroxide used in the wet etching method, and to prevent the undercut on the tapered surface of bottom portion of through-hole in the polyimide layer caused by the generation of corrosion. Further, it is possible to remove failure in burrying of metal wiring layers to be laminated, and to remove generation of pin holes in the polyimide insulating film for producing good upper wiring layer, resulting in producing the multilayer wiring substrate having high reliability with high productivity.

The present invention is illustrated in detail referring to FIGS. 1 and 2.

FIG. 1 is a cross-sectional view of a part of multilayer wiring substrate. FIGS. 2A to 2D are cross-sectional views explaining the wet etching method conducted at the portion "A" shown in FIG. 1 according to the process of the present invention, corresponding to FIGS. 3A to 3D of prior art process. In FIGS. 1 and 2, the same numerals as used in FIG. 3 are used. In FIGS. 1 and 2, numeral 8 denotes interlayer wiring of mullite substrate 1 (formed by steps of printing a wiring material on a green sheet, laminating and pressing, and sintering). As a wiring material, a metal of W is used from the viewpoints of electric properties and simultaneous sintering properties with the mullite substrate 1. In this case, the wiring material for the interlayer wiring 8 can be Mo or Cu in place of W. As the ceramic substrate, there can be used an alumina substrate or SiC substrate in place of the mullite substrate 1. Numeral 9 denotes a stabilization treated layer which is a passivated layer formed by, for example, sputtering Cr in 0.15 $\mu$m thick on an Al wiring layer 2 formed by sputtering Al which is low in electrical resistance in a predetermined thickness (for example, 4 $\mu$m) on an upper surface of mullite substrate 1 subjected to sputter cleaning, in continuation (sputtering conditions: power 17A, period 120 seconds). In this case, the Al wiring layer 2 can be replaced by a Cu wiring layer 2 wherein Cu is also low in electrical resistance like Al. Further, the stabilization treated layer 9 can be a coating layer of Mo. The thickness of the metal coating layer of the stabilization treated layer 9 is preferably 0.05 to 0.5 μm. When the thickness is too small, it is difficult to obtain the stabilization treating effect, while when the thickness is too large, there is a tendency to generate cracks on the coating layer or it is difficult to obtain th desired etching precision at the time of pattern formation.

Numeral 10a is a metal wiring layer formed by patterning the Al of Al wiring layer 2 and the Cr of stabilization treated layer 9. Numeral 3a is a polyimide insulating layer formed as an organic insulating layer by spin coating a polyimide precursor varnish on the metal wiring layer 10a and the mullite substrate 1, followed by curing with heating preferably at 300° to 450° C. for 30 to 120 minutes. In this case, the use of a polyimide resin is preferable as the organic insulating layer from the viewpoint of heat resistance. Numerals 10b, 10c and 10d are metal wiring layers formed in the same manner as the metal wiring layer 10a and laminated alternately with polyimide insulating layers 3b, 3c and 3d formed in the same manner as the polyimide insulating layer 3a. Numeral 11 is a front side surface terminal made from a thin film circuit layer equipped with a terminal to be connected to LSI formed on the polyimide insulating layer 3d which is a surface layer of the thus alternately laminated layers. Numeral 12 is a back side surface terminal made from a thin film circuit layer in the same manner as the front side surface terminal and formed on a side of the mullite substrate 1 opposite to the front side surface terminal 11.

The present invention is illustrated by way of the following Examples.

EXAMPLE 1

A multilayer wiring substrate as shown in FIG. 1 was produced by a process partly shown in FIG. 2.

First, a thick film of mullite substrate 1 was prepared. After sputter cleaning the upper surface of the mullite substrate 1, an Al wiring layer 2 was formed by sputtering Al in predetermined thickness (e.g. 4 μm) on the mullite substrate, followed by formation of passivation film of Cr by sputtering in 0.15 μm thick on the Al wiring layer 2 to continuously form a laminating layer, that is, the stabilization treated layer 9. In this case, the Al wiring layer 2 can be replaced by a Cu wiring layer 2. Further, the stabilization treated layer 9 can be a metal coating of Mo. The thickness of the metal coating as the stabilization treated layer 9 was preferably in the range of 0.05 to 0.5 μm. Then, the metal wiring layer 10a was formed by patterning the Al in the Al wiring layer 2 and the Cr in the stabilization treated layer 9 by a conventional hot etching process, followed by connection to the circuit of the mullite substrate 1.

Then, a polyimide precursor varnish was spin coated on the metal wiring layer 10a and the mullite substrate 1, followed by curing with heating at 100° C. for 60 minutes, 200° C. for 60 minutes, and 400° C. for 60 minutes in a nitrogen atmosphere to form a polyimide insulating layer 3a of 15 μm thick. The thus formed polyimide insulating layer 3a was subjected to formation of an etching resist pattern using a negative type photoresist 4 (e.g. ONNR-20, a trade name, mfd. by Tokyo Ohka Kogyo Co., Ltd.). The resist pattern formed was subjected to etching using an etching solution (hydrazine hydrate/ethylenediamine =7/3 by volume) at 30° C. to form a contact throughhole 7, followed by release of the negative type photoresist 4.

Under this state, the surfaces of the contact throughhole 7 and the surface of metal wiring layer 10a exposed by etching of the polyimide insulating layer 3a were observed. As a result, it was confirmed that the contact through-hole 7 was formed without defect to have an upper diameter of 70 μm, a lower diameter of 50 μm and a taper angle of 55° when a photomask having a diameter of 50 μm was used. As to the metal wiring layer 10a, good results were observed without generating corrosion by the etching solution and without generating hillocks and whiskers by the heat curing of the polyimide insulating layer 3a.

Figure 2A:
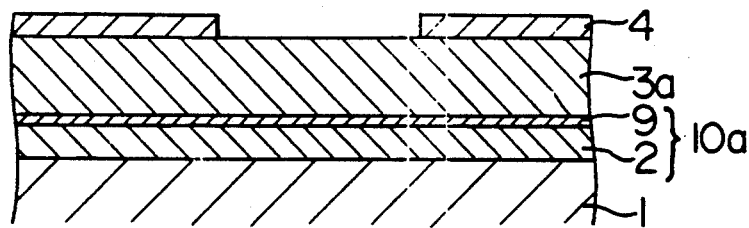
FIGS. 2A to 2D are cross-sectional views explaining the wet etching method conducted at the portion "A" shown in FIG. 1 according to the process of the present invention.
Figure 2B:
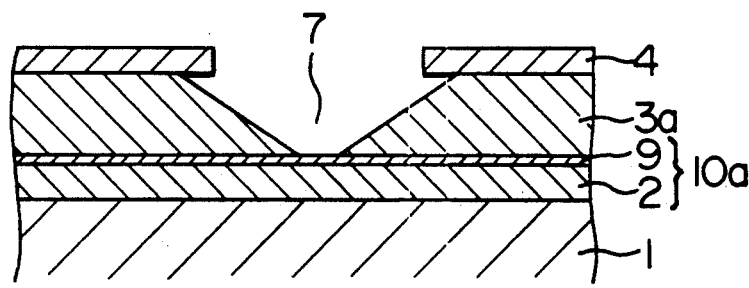
Figure 2C:
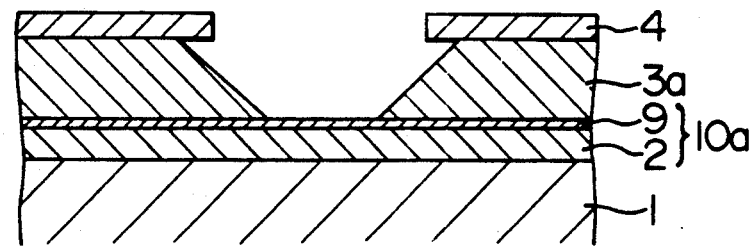
Figure 2D:
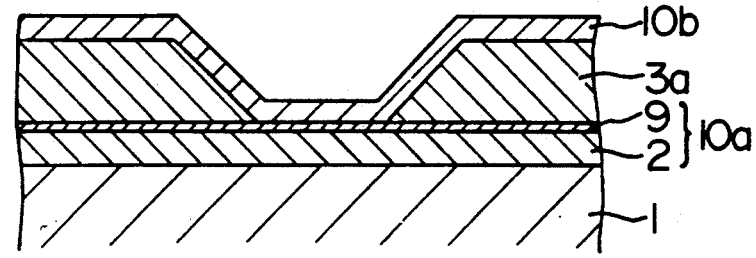

Then, a metal wiring layer 10b was formed in the thus formed contact through-hole 7 in the same manner as the metal wiring layer 10a [FIG. 2D]. Then, a polyimide insulating layer 3b was formed on the metal wiring layer 10b in the same manner as mentioned above. By repeating alternately, metal wiring layers 10c and 10d and polyimide insulating layers 3c and 3d were formed. After forming each polyimide insulating film, the surface states were observed in the same manner as mentioned above to obtain the same good results without any defects as mentioned above.

Then, the upper surface of the polyimide insulating film 3d after formation of a contact through-hole 7 was subjected to sputter cleaning, followed by formation of Cr layer of 0.05 μm thick and Ni-Cu alloy layer of 0.5 μm thick by sputtering continuously. The resulting layers were patterned by a conventional photo-etching process, followed by formation of a layer of surface terminal 11 by electroless plating of Au in 3 μm thick. Then, a thin film layer was formed on a back side of the mullite substrate 1 opposite to the surface terminal 11 in the same manner as mentioned above for forming the surface terminal 11 by sputtering, followed by formation of a layer of Ni in 4 μm thick and a layer of Au in 3 μm thick by electroless plating to form a layer of back-side terminal 12.

EXAMPLE 2

The process of Example 1 was repeated except for changing the stabilization treatment of individual metal wiring layers.

That is, after forming the Al wiring layer 2 in the predetermined thickness by sputtering Al, the stabilization treatment were carried out by dipping the Al wiring layer 2 in an aqueous solution of 10% water glass at 40° C. for 5 minutes, followed by washing with deionized water for 10 minutes to form a stabilization treated layer 9. Thus, the metal wiring layers 10a, 10b, 10c and 10d were formed in the same manner as mentioned in Example 1.

The resulting multilayer wiring substrate showed the same good properties as obtained in Example 1.

COMPARATIVE EXAMPLE 1

The process of Example 1 was repeated except for omitting the formation of the stabilization treated layer 9 on each Al wiring layer 2.

The resulting multilayer wiring substrate showed the undercut of polyimide caused by corrosion of Al in all the metal wiring layers, failure in contact of upper and lower metal wiring layers, short circuit between individual metal wiring layers caused by hillocks, and various defects caused by the absence of the stabilization treated layers.

In the above-mentioned Examples, the use of the organic insulating layer requiring the etching process is explained. But when a thin insulating layer of 10 μm or less is usable, it is possible to use not only a photosensitive polyimide but also a mixture of a photosensitive polyimide and a usual polyimide as an organic insulating layer.

Further, it is possible to mount one or more functional thin films such as termination resistor, etc. on the same plane as the metal wiring layer.

As mentioned above, according to the present invention, since the metal wiring layer is subjected to stabilization treatment on the surface, thin layer multilayering having a metal layer structure excellent in preventing hillocks and whickers and excellent in chemical resistance can be realized, and multilayer wiring substrates having high reliability can be produced in good productivity by preventing the process damage at the time of forming polyimide insulating layer.

What is claimed is:

1. A multilayer wiring substrate comprising (1) a ceramic substrate having opposed major surfaces and containing a circuit comprising interlayer wirings in the ceramic substrate and first terminals for at least one of power supply and signal input and output, (2) alternately laminated layers of metal wiring layers and organic insulating layers, formed on at least one of the opposed major surfaces of the ceramic substrate, the organic insulating layers having holes therethrough, the metal wiring layers being electrically connected to each other via the holes through the organic insulating layers, a first portion of at least one of the metal wiring layers being provided beneath an immediately overlying organic insulating layer and a second portion of said at least one of the metal wiring layers being provided beneath a respective hole through the immediately overlying organic insulating layer, each of said at least one of the metal wiring layers having a stabilization treatment layer formed thereon (a) by coating, on said each of said at least one of the metal wiring layers, a metal selected from the group consisting of Cr, Mo, W, Cu, Au and Ni-Cu, the coating being provided between an upper metal wiring layer and a lower metal wiring layer where the upper and lower metal wiring layers are electrically connected to each other, or (b) by dipping in an aqueous solution of water glass, said stabilization treatment layer extending on a respective metal wiring layer both on the first portion of the respective metal wiring layer and on the second portion of the respective metal wiring layer, and (3) a thin film circuit layer having second terminals, for at least one of power supply and signal input and output, to be connected to a large-scale integrated circuit, the thin film circuit layer being formed on a surface of the laminated layers.

2. A multilayer wiring substrate according to claim 1, wherein the interlayer wirings are made of a metallic material of W, Mo or Cu.

3. A multilayer wiring substrate according to claim 1, wherein the ceramic substrate is made of alumina, mullite, SiC or glass ceramic.

4. A multilayer wiring substrate according to claim 1, wherein the metal wiring layers are made of a conductive material selected from the group consisting of Al, Cu, Al-Si, Al-Si-Ti, and Al-Cu.

5. A multilayer wiring substrate according to claim 1, wherein the metal coating has a thickness of 0.05 to 0.5 μm.

6. A multilayer wiring substrate according to claim 1, wherein the metal wiring layers that have been subjected to a stabilization treatment are metal-coated metal wiring layers, the metal coating being of said metal selected from the group consisting of Cr, Mo, W, Cu, Au and Ni-Cu.

7. A multilayer wiring substrate according to claim 6, wherein the metal coating is of a metal selected from the group consisting of Mo, W, Cu, Au and Ni-Cu.

8. A multilayer wiring substrate according to claim 1, wherein the metal coating is of a metal selected from the group consisting of Mo, W, Cu, Au and Ni-Cu.

9. A multilayer wiring substrate according to claim 1, wherein the metal wiring layers that have been subjected to a stabilization treatment are metal wiring layers that have been dipped in an aqueous solution of water glass.

10. A multilayer wiring substrate according to claim 9, wherein the metal wiring layers are made of Al.

11. A multilayer wiring substrate according to claim 1, wherein the organic insulating layers are made of a polyimide resin.

12. A multilayer wiring substrate comprising:
(1) a ceramic substrate having opposed major surfaces and containing a circuit including interlayer wirings in the ceramic substrate and first terminals for at least one of power supply and signal input and output;
(2) alternately laminated layers of metal wiring layers and organic insulating layers, formed on at least one of the opposed major surfaces of the ceramic substrate, the organic insulating layers having holes therethrough, the metal wiring layers being electrically connected to each other via the holes through the organic insulating layers, a first portion of at least one of the metal wiring layers being provided beneath an immediately overlying organic insulating layer, and a second portion of said at least one of the metal wiring layers being provided beneath holes through the immediately overlying organic insulating layer, each of the metal wiring layers having been subjected to a stabilization treatment prior to forming the respective immediately overlying organic insulating layer, said stabilization treatment providing a stabilization treatment layer on each of the at least one of the metal wiring layers, including where an immediately overlying metal wiring layer is electrically connected to the respective lower metal wiring layer, such that said metal wiring layers are not corroded by an etchant used to etch a respective immediately overlying organic insulating layer in forming said holes through said immediately overlying organic insulating layer, said stabilization treatment layer extending on a respective metal wiring layer both on the first portion of the respective metal wiring layer and on the second portion of the respective metal wiring layer; and
(3) a thin film circuit layer having second terminals for at least one of power supply and signal input and output to be connected to a large scale integrated circuit and formed on a surface of the laminated layers.

13. A multilayer wiring substrate according to claim 12, wherein the organic insulating layers are made of a polyimide resin.

14. A multilayer wiring substrate according to claim 13, wherein the metal wiring layers are made of a conductive material selected from the group consisting of Al, Cu, Al-Si, Al-Si-Ti and Al-Cu.

15. A multilayer wiring substrate according to claim 14, wherein the stabilization treatment layer is a layer formed by coating each of the metal wiring layers with a metal selected from the group consisting of Cr, Mo, W, Cu, Au and Ni-Cu, or by dipping each of the metal wiring layers, prior to forming the immediately overlying organic insulating layer, in an aqueous solution of water glass.

16. A multilayer wiring substrate according to claim 1, wherein said stabilization treatment layer extends continuously on said first portion and said second portion of each of the metal wiring layers.

17. A multilayer wiring substrate according to claim 12, wherein said stabilization treatment layer extends continuously on said first portion and on said second portion of each of the metal wiring layers.

* * * * *